(12) United States Patent
Taguchi

(10) Patent No.: US 7,839,671 B2
(45) Date of Patent: Nov. 23, 2010

(54) RESISTIVE MEMORY CELL ARRAY WITH COMMON PLATE

(75) Inventor: Masao Taguchi, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/290,179

(22) Filed: Oct. 28, 2008

(65) Prior Publication Data

US 2009/0059652 A1 Mar. 5, 2009

Related U.S. Application Data

(62) Division of application No. 11/412,589, filed on Apr. 27, 2006, now Pat. No. 7,495,951.

(51) Int. Cl.
*G11C 11/00* (2006.01)

(52) U.S. Cl. .................. 365/148; 365/63; 365/163; 365/189.06

(58) Field of Classification Search ............. 365/148, 365/63, 163, 189.06
See application file for complete search history.

(56) References Cited

U.S. PATENT DOCUMENTS

| | | | |
|---|---|---|---|
| 6,477,090 B2 * | 11/2002 | Yamaki et al. ......... | 365/189.09 |
| 6,859,382 B2 | 2/2005 | Rinerson et al. ............ | 365/148 |
| 6,898,106 B2 * | 5/2005 | Hoenigschmid et al. .... | 365/145 |
| 6,909,656 B2 * | 6/2005 | Moore et al. ................ | 365/222 |
| 7,002,197 B2 * | 2/2006 | Perner et al. ................ | 257/295 |
| 2004/0160817 A1 | 8/2004 | Rinerson et al. ............ | 365/171 |
| 2005/0169095 A1 * | 8/2005 | Bedeschi et al. ............ | 365/232 |

* cited by examiner

*Primary Examiner*—Son Dinh

(57) ABSTRACT

In the present method of changing the state of a resistive memory device which is capable of adopting an erased, relatively higher resistance state and a programmed, relatively lower resistance state, the resistive memory device having first and second electrodes and an active layer between the first and second electrodes, an electrical potential is applied across the electrodes and current through the resistive memory device is limited by means of a first current limiting structure to change the resistive memory device from the erased, higher resistance state to the programmed, lower resistance state. Furthermore, an electrical potential is applied across the electrodes and current through the resistive memory device is limited by means of a second current limiting structure to change the resistive memory device from the programmed, lower resistance state to the erased, higher resistance state.

13 Claims, 14 Drawing Sheets

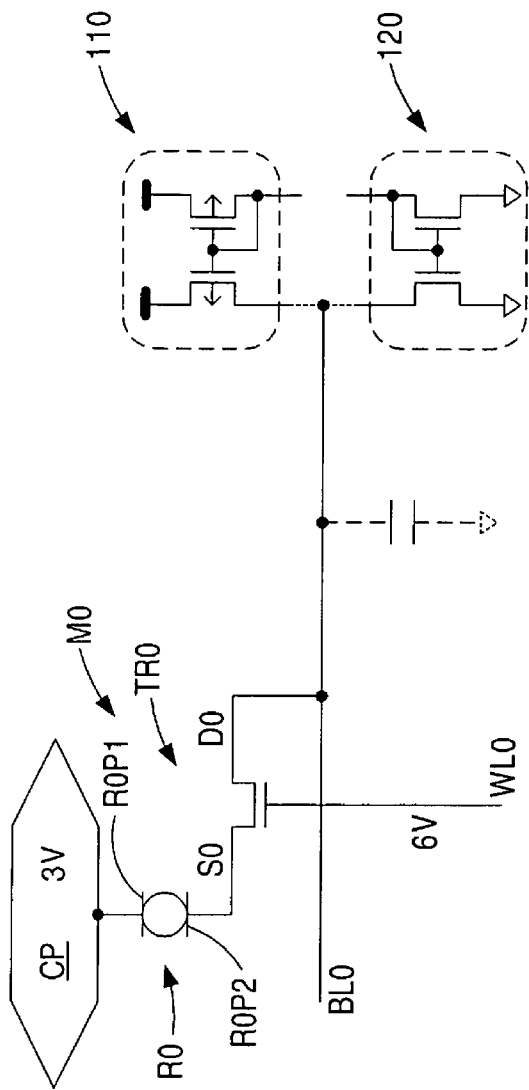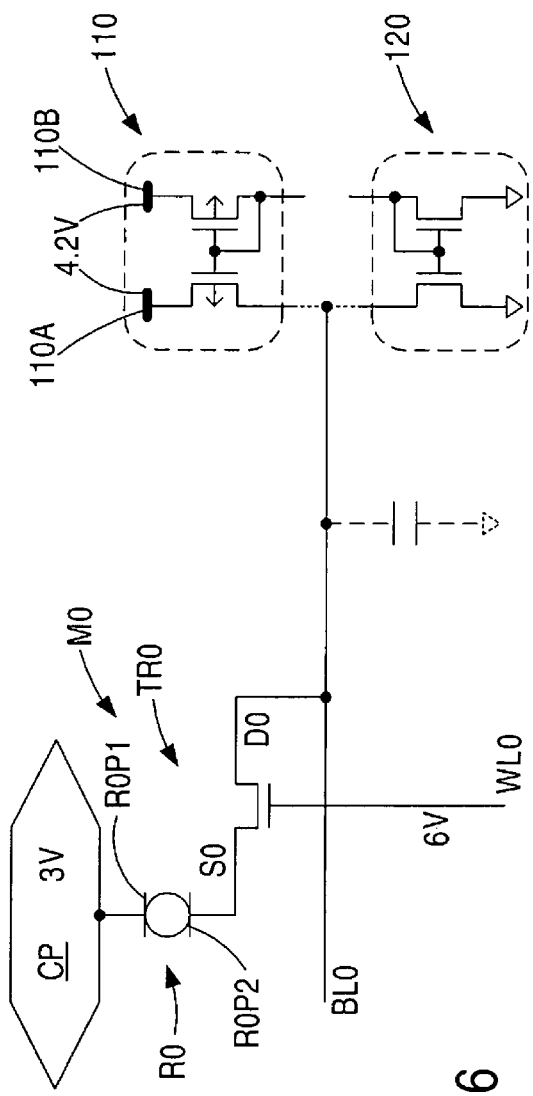
FIGURE 5
FIGURE 6

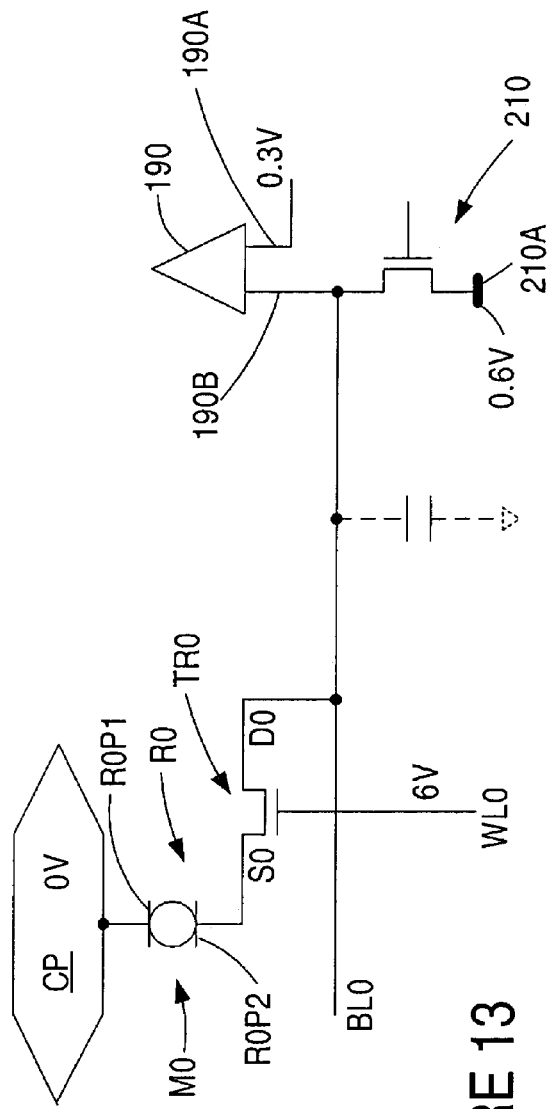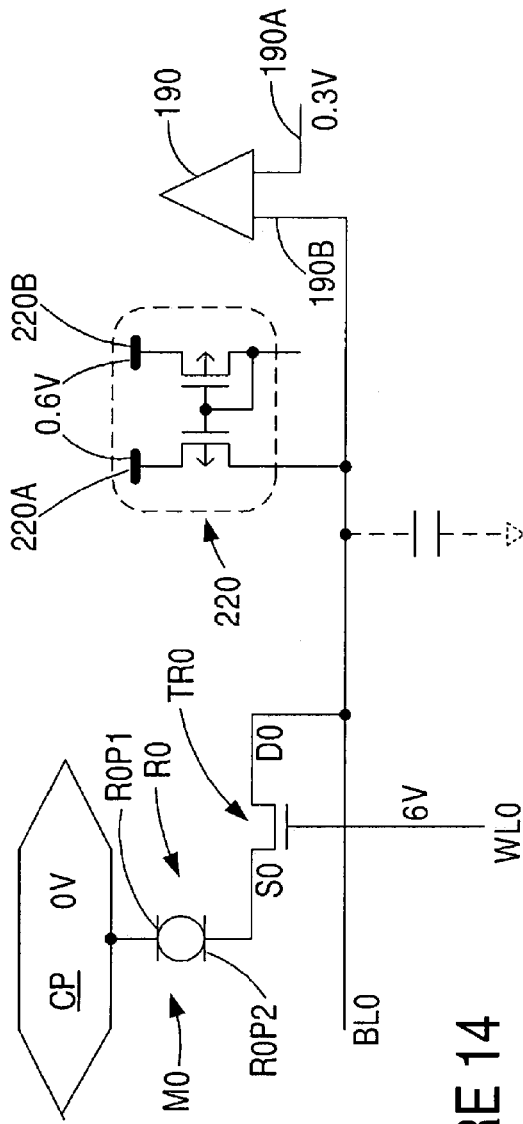
FIGURE 13
FIGURE 14

US 7,839,671 B2

RESISTIVE MEMORY CELL ARRAY WITH COMMON PLATE

This is a Divisional Application of U.S. patent application Ser. No. 11/412,589 entitled RESISTIVE MEMORY CELL ARRAY WITH COMMON PLATE, filed Apr. 27, 2006, now U.S. Pat. No. 7,495,951 assigned to Spansion LLC.

BACKGROUND OF THE INVENTION

1. Technical Field

This invention relates generally to memory devices, and more particularly, to a memory array which includes a plurality of resistive memory devices.

2. Background Art

FIG. 1 is a schematic representation of a portion of a typical DRAM memory array 100. The array 100 includes a plurality of word lines (two shown at WL0, WL1), and a plurality of bit lines (one shown at BL0). The array 100 includes a large number of similar memory cells (two memory cells MC0, MC1 shown in FIG. 1). The memory cell MC0 includes a transistor T0 having its drain D0 connected to the bit line B0 and a capacitor C0 having first and second plates C0P1, C0P2, plate C0P1 being connected to the source S0 of the transistor T0. The word line WL0 is connected to the gate G0 of the transistor T0. Likewise, memory cell MC1 includes a transistor T1 having its drain D1 connected to the bit line B0 and a capacitor C1 having first and second plates C1P1, C1P2, plate C1P1 being connected to the source S1 of the transistor T1. The word line WL1 is connected to the gate G1 of the transistor T1. The plates C0P2, C1P2 of the respective capacitors C0, C1 are connected, giving rise to the term "common plate" (CP).

It will be understood that the two cells MC0, MC1 shown and described are part of a large number of such memory cells in the array 100.

The data storing mechanism of each memory cell is based upon the presence or absence of electric charge accumulated in the capacitor. The presence or absence of the electric charge in the capacitor can be sensed by means of sense amplifier SA (connected to a bit line BL0), sensing current in the bit line BL0. The programming and erasing of each cell is undertaken in a well known manner.

Recently, an approach has been undertaken where, in effect, each of the capacitors of the array 100 of FIG. 1 is replaced by a metal-insulator-metal (MIM) resistive memory device. Such a device is capable of adopting a low-resistance ("programmed") state and a high resistance ("erased") state by application of electrical potentials thereacross, so that upon application of an appropriate electrical potential applied across the device, the level of current therethrough can be sensed, indicating whether the device is in its high or low resistance state (the "read" step).

While resistive memory devices of this type provide significant advantages, the proper programming, erasing and reading of devices in an array of the type described have proven challenging. It is of course understood that the programming, erasing and reading of a selected device in the array must be effective and reliable. The goal of the present approach is to achieve a high level of such effectiveness and reliability.

DISCLOSURE OF THE INVENTION

In the present method of changing the state of a resistive memory device which is capable of adopting an erased, relatively higher resistance state and a programmed, relatively lower resistance state, the resistive memory device comprising first and second electrodes and an active layer between the first and second electrodes, the method comprises applying an electrical potential across the electrodes and limiting current through the resistive memory device by means of a first current limiting structure to change the resistive memory device from the erased, higher resistance state to the programmed, lower resistance state, and applying an electrical potential across the electrodes and limiting current through the resistive memory device by means of a second current limiting structure to change the resistive memory device from the programmed, lower resistance state to the erased, higher resistance state.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiment when read in conjunction with the accompanying drawings, wherein:

FIG. 5 is a schematic representation of a memory cell of the array of FIG. 2, which array includes resistive memory devices of the type shown in FIG. 3, illustrating a method of writing data to a memory device;

FIG. 6 is a schematic representation of the memory cell of FIG. 5, illustrating a method of erasing the memory device;

FIG. 13 is a schematic representation of the memory cell of FIG. 11, illustrating a first method of reading the state of the memory device;

FIG. 14 is a schematic representation of the memory cell of FIG. 11, illustrating a second method of reading the state of the memory device.

BEST MODE(S) FOR CARRYING OUT THE INVENTION

Reference is now made in detail to specific embodiments of the present invention which illustrate the best mode presently contemplated by the inventor for practicing the invention.

Figure 1:
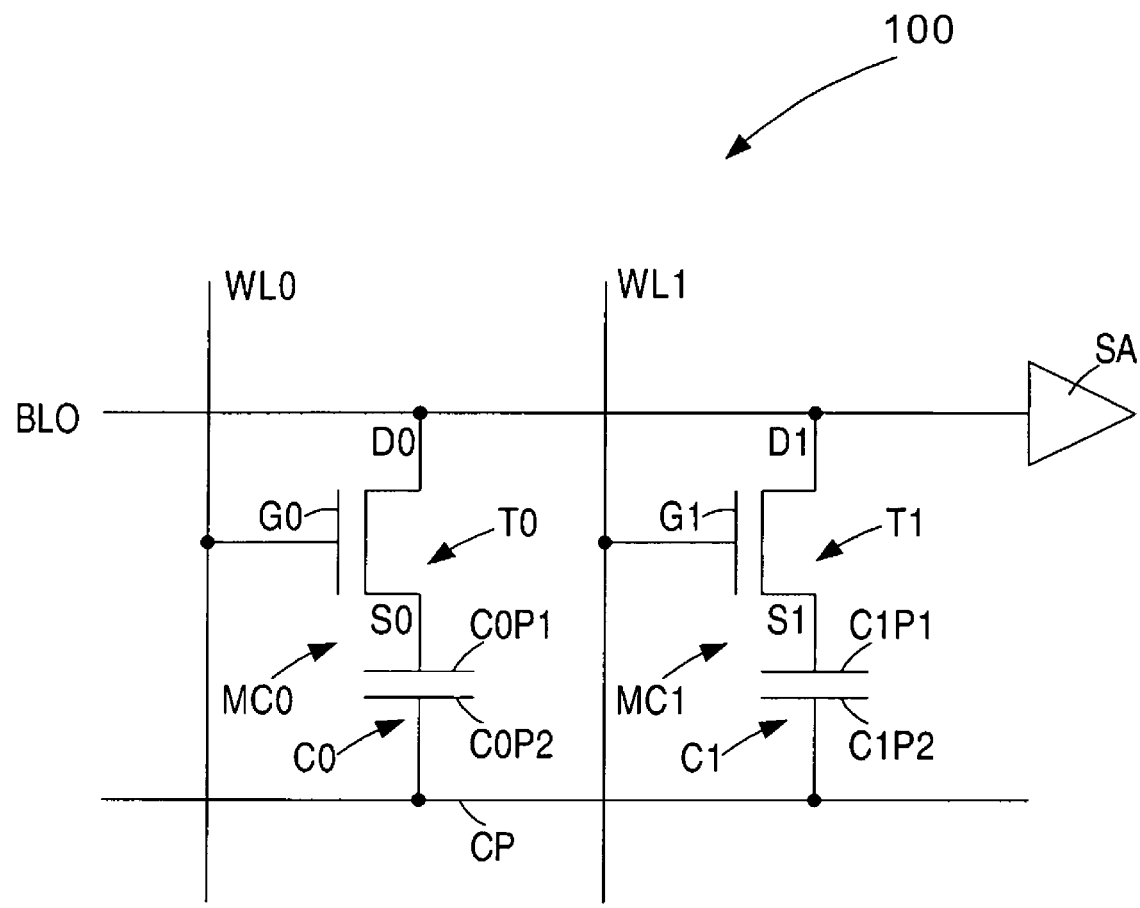
FIG. 1 is a schematic representation of a portion of a typical DRAM memory array.
Figure 2:
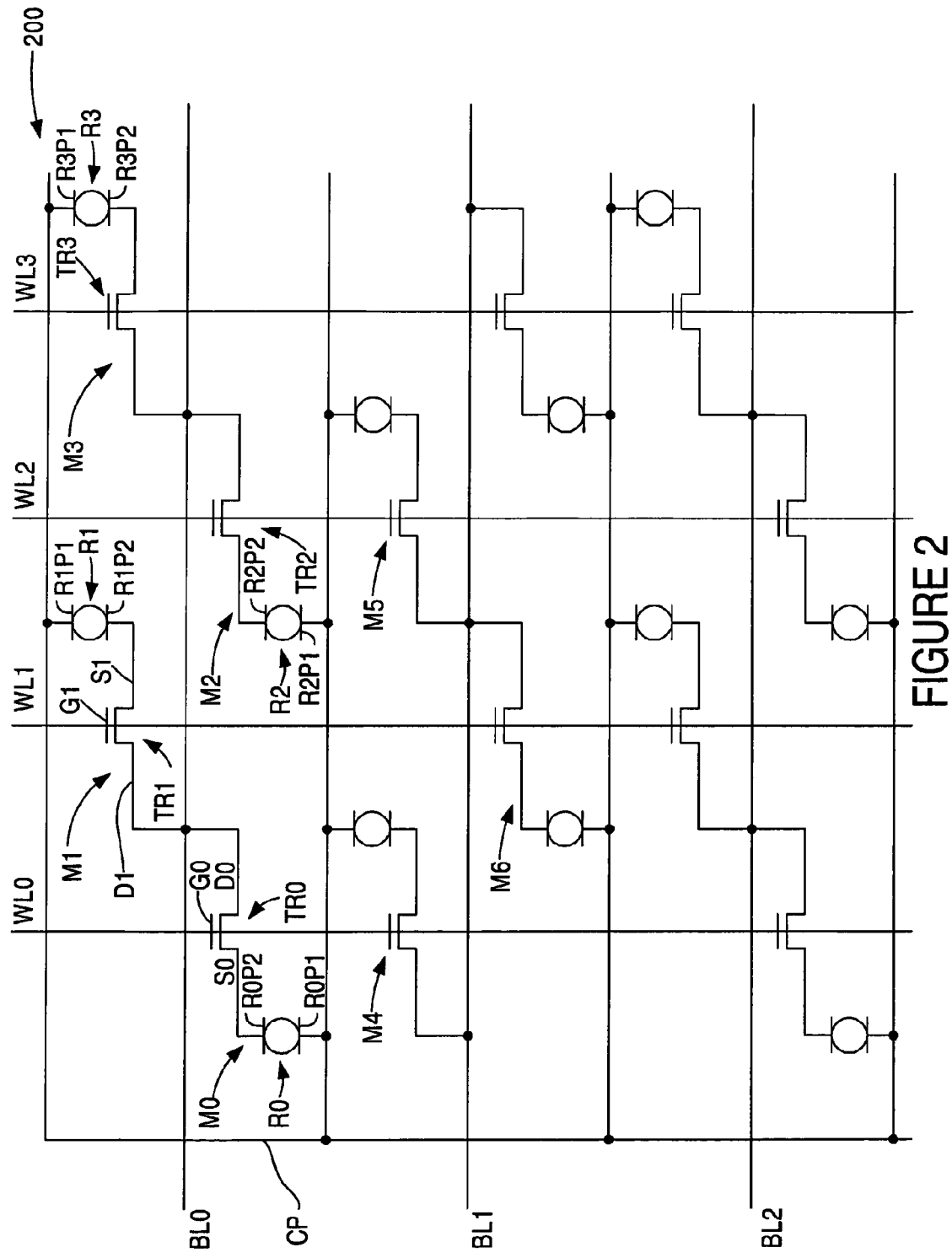
FIG. 2 is a schematic representation of a portion of the present resistive memory array.

FIG. 2 is a schematic representation of a resistive memory device array 200 made in accordance with the present invention. It will be understood that FIG. 2 illustrates a very small portion of the overall array 200. The array 200 includes a plurality of word lines WL0, WL1, WL2, WL3 . . . and a plurality of bit lines BL0, BL1, BL2 . . . orthogonal to the word lines. A plurality of memory cells M0, M1, M2, M3 . . . are provided, each including a resistive memory device (R0, R1, R2, R3 . . . respectively) the form of which will be shown and described further on, and an access MOS transistor (TR0, TR1, TR2, TR3) in series with the associated resistive memory device. That is, for example, the memory cell M0 includes resistive memory device R0 having electrode R0P1 thereof connected to the electrodes R1P1, R2P1, R3P1 . . . of the respective memory devices M1, M2, M3 . . . , electrode R0P2 connected to the source S0 of the transistor TR0, and drain D0 of the transistor TR0 connected to the bit line BL0. Similarly, the memory cell M1 includes resistive memory device R1 having electrode R1P1 thereof connected to the electrodes R0P1, R2P1, R3P1 . . . of the respective memory devices M0, M2, M3 . . . , electrode R1P2 connected to the source S1 of the transistor TR1, and drain D1 of the transistor TR1 connected to the bit line BL0. It will be seen that the electrodes R0P1, R1P1, R2P1, R3P1 . . . of the respective memory cells M0, M1, M2, M3 . . . are commonly connected in a manner which will be shown and described in detail further on, using a common plate CP.

Figure 3:
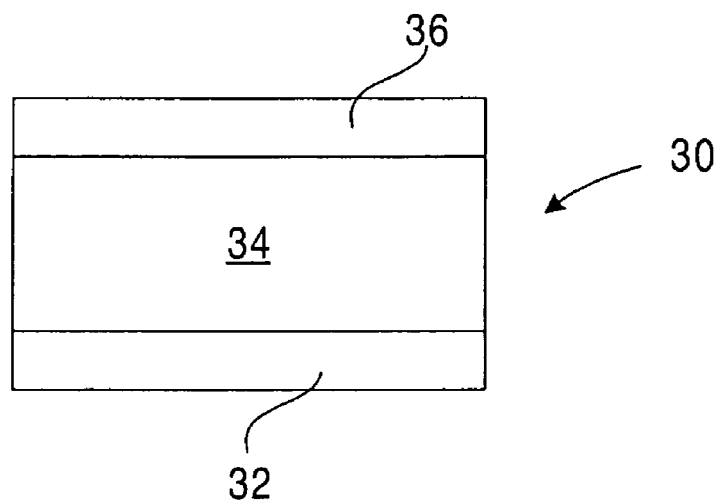
FIG. 3 is a cross sectional view of a first embodiment of resistive memory device for practice of the present invention.

FIG. 3 illustrates a two-terminal metal-insulator-metal (MIM) resistive memory device 30. The memory device 30 includes a metal, for example copper electrode 32, an active layer 34 of for example copper oxide or tantalum oxide on and in contact with the electrode 32, and a metal, for example copper electrode 36 on and in contact with the active layer 34. Each of the resistive memory devices of the array 200 may take the form of the memory device 30 shown and described.

Figure 4:
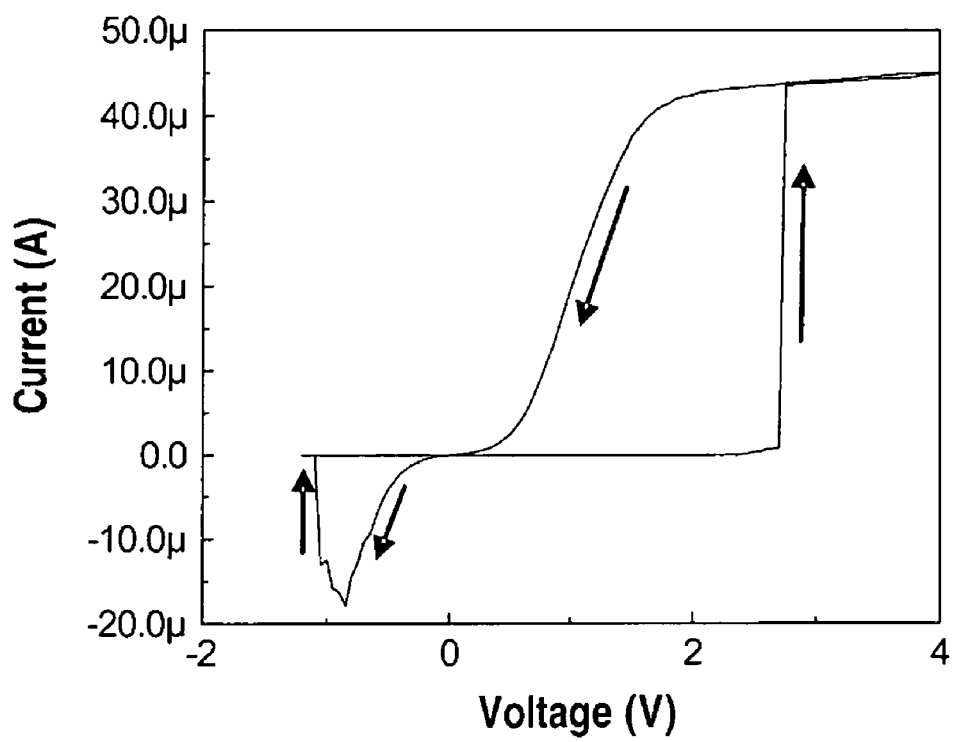
FIG. 4 is a plot of current vs. voltage illustrating operating characteristics of the memory device of FIG. 3.

Throughout the following description of the programming, erasing and reading of this first embodiment of resistive memory device 30, reference is made to FIG. 4 illustrating the operating characteristics of this resistive memory device 30.

FIG. 5 illustrates the programming of an individual memory cell, for example memory cell M0 of the array 200, for achieving a low-resistance state of the resistive memory device R0 of the type shown and described with regard to FIGS. 3 and 4. As set forth above with regard to FIG. 2, the memory cell M0 includes resistive memory device R0 having electrode R0P1 thereof connected to common plate CP, electrode R0P2 connected to the source S0 of the transistor TR0, and drain D0 of the transistor TR0 connected to the bit line BL0. Also connected to the bit line BL0 are a current source/limiter 110, including p channel transistors connected as a current mirror, and a current source/limiter 120 including n channel transistors connected as a current mirror.

In the programming of the memory cell M0, initially, the common plate CP is biased at 3V, and the bit line BL0 is connected to ground through the current source 120. The word line WL0 is driven to for example 6V, sufficient to turn the transistor TR0 completely on, so that a potential of 3.0 V is applied across the electrodes R0P1, R0P2 from higher to lower potential across the resistive memory device R0 in the direction from the electrode R0P1 to the electrode R0P2. In such state, and with reference to FIG. 4, current flows from the common plate CP through the resistive memory device R0, through the transistor TR0 and bit line BL0, and through the current source/limiter 120 to ground. The voltage applied across the electrodes R0P1, R0P2 is sufficient to drive the resistive memory device R0 into a low-resistance state, the current source/limiter 120 limiting current to, for example, a relatively low level of approximately 40 uA so as to avoid the possibility of damage to the cell M0.

In the erasing of the memory cell M0 (FIG. 6), the terminals 110A, 110B of the current source/limiter 110 are set at 4.2 V, so that the voltage at the bit line BL0 is 4.2V. Meanwhile, the voltage at the common plate (CP) continues to be held at 3.0V, so that the voltage across the electrodes R0P1, R0P2 of the resistive memory device R0 is 1.2V from higher to lower potential in the direction from the electrode R0P2 to the electrode R0P1. The word line WL0 is again held at 6V. The voltage across the electrodes R0P2, R0P1 is sufficient to drive the resistive memory device R0 into a high-resistance state, the current source/limiter 110 limiting current to a relatively low level of approximately 20 uA to again avoid the possibility of damage to the cell M0.

Figure 7:
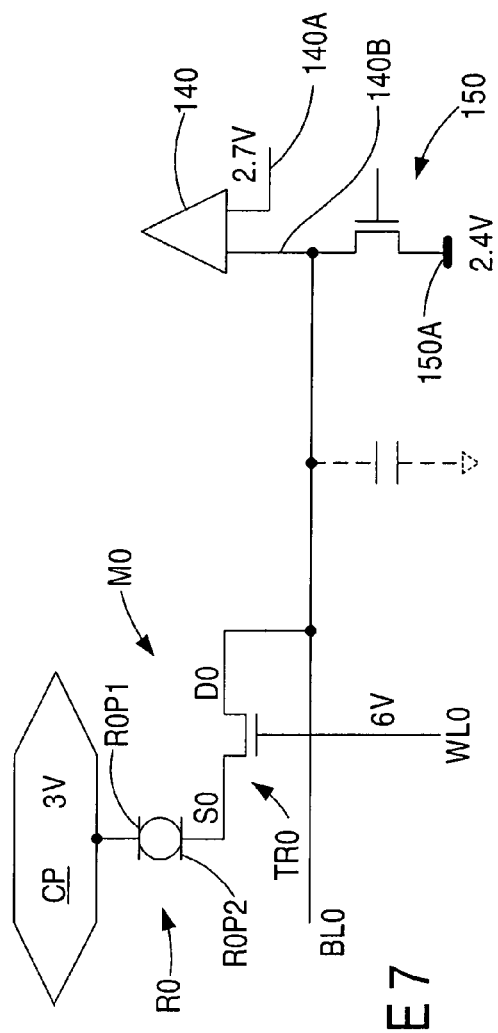
FIG. 7 is a schematic representation of the memory cell of FIG. 5, illustrating a first method of reading the state of the memory device.

A first approach to reading the state of the memory cell M0 is shown in FIG. 7. In this approach, bit line BL0 has connected thereto a transistor 150 and a sense amplifier 140. The common plate CP continues to be held at 3.0V, a reference voltage of 2.7V is applied to one input terminal 140A of the sense amplifier 140, and the input terminal 150A of the transistor 150 is held at 2.4V, which precharges the bit line BL0 to 2.4V, so that this voltage of 2.4V, with transistor 150 turned on, is applied to the other input terminal 140B of the sense amplifier 140. 6V is applied to the word line WL0. If the resistive memory device R0 is in a high-resistance state, the bit line BL0 voltage (and the voltage applied to the input terminal 140B of the sense amplifier 140) remain at 2.4V, this voltage being lower than the reference voltage of 2.7V applied to the terminal 140A of the sense amplifier 140, determining a first output state of the sense amplifier 140 corresponding to the erased (high-resistance) state of the memory cell M0. If the resistive memory device R0 is in a low-resistance state, the bit line voltage is driven to 3.0V, the voltage of the common plate CP. This voltage of 3.0V is applied to the input terminal 140B of the sense amplifier 140, which voltage is higher than the reference voltage (2.7V) applied to the input terminal 140A of the sense amplifier 140. In this state, the output of the sense amplifier 140 is switched to determine a second output state thereof corresponding to the programmed (low-resistance) state of the memory cell M0.

Figure 8:
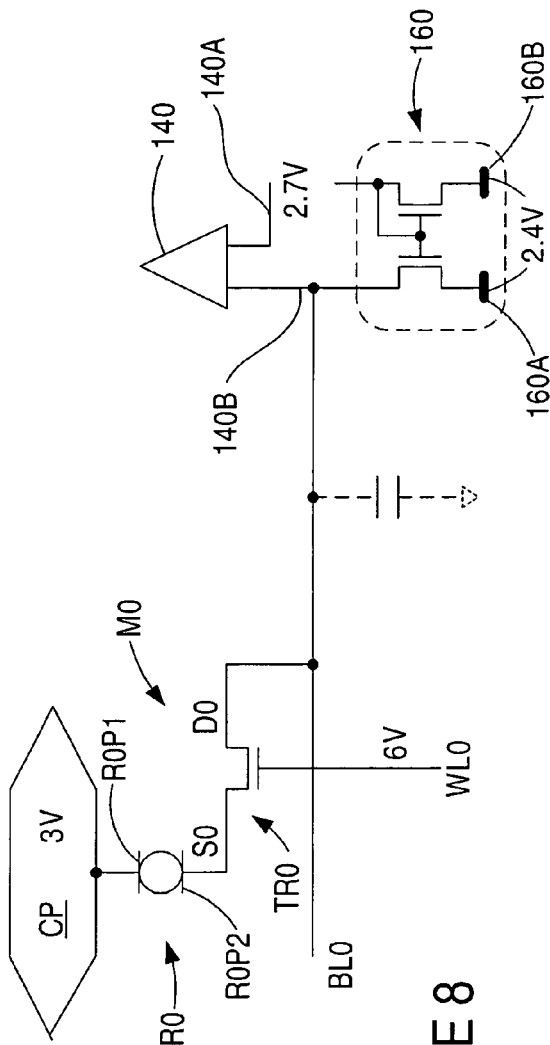
FIG. 8 is a schematic representation of the memory cell of FIG. 5, illustrating a second method of reading the state of the memory device.

A second approach to reading the state of the memory cell M0 is shown in FIG. 8. In this approach, bit line BL0 has connected thereto a current source/limiter 160 and a sense amplifier 140. The current source/limiter 160 includes n channel transistors connected in the form of a current mirror. The common plate CP continues to be held at 3.0V, a reference voltage of 2.7V is applied to input terminal 140A of the sense amplifier 140, and 2.4V is applied to the terminals 160A, 160B of the current source/limiter 160. 6V is applied to the word line WL0. If the resistive memory device R0 is in a high-resistance state, the bit line BL0 voltage (and the voltage applied to the input terminal 140B of the sense amplifier 140) remain at 2.4V, this voltage being lower than the reference voltage of 2.7V applied to input terminal 140A of the sense amplifier 140, determining a first output state of the sense amplifier 140 corresponding to the erased (high-resistance) state of the memory cell M0. If the resistive memory device R0 is in a low-resistance state, the bit line voltage is driven to 3.0V, the voltage of the common plate CP. This voltage of 3.0V is applied to the input terminal 140B of the sense amplifier 140, which voltage is higher than the reference voltage (2.7V) applied to the input terminal 140A of the sense amplifier 140. In the state, the output of the sense amplifier 140 is switched to determine a second output state thereof corresponding to the programmed (low-resistance) state of the memory cell M0.

It is to be noted that throughout the writing, erasing and reading operations the common plate CP is continuously held at a constant voltage, in this example, 3.0V. This approach avoids creation of charge-discharge current which would be imposed with varying voltages on the common plate CP, which would increase power consumption. In addition, the applied voltages and current limits are carefully selected to provide rapid and effective writing, erasing and reading operations, meanwhile with it being insured that there are no high currents which could cause damage to the memory cell or other associated structure.

Figure 9:
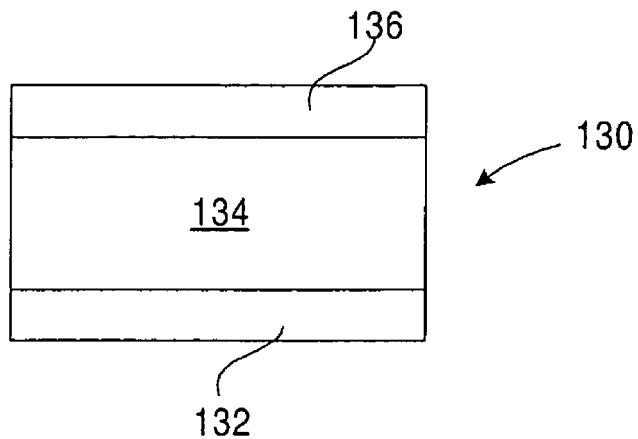
FIG. 9 is a cross sectional view of a second embodiment of resistive memory device for practice of the present invention.

FIG. 9 illustrates another embodiment of two-terminal metal-insulator-metal (MIM) resistive memory device 130. The memory device 130 includes a metal, for example copper electrode 132, an active layer 134 of for example nickel oxide on and in contact with the electrode 132, and a metal, for example copper electrode 136 on and in contact with the active layer 134. Each of the resistive memory devices of the array 200 may take the form of the resistive memory device 130 shown and described.

Figure 10:
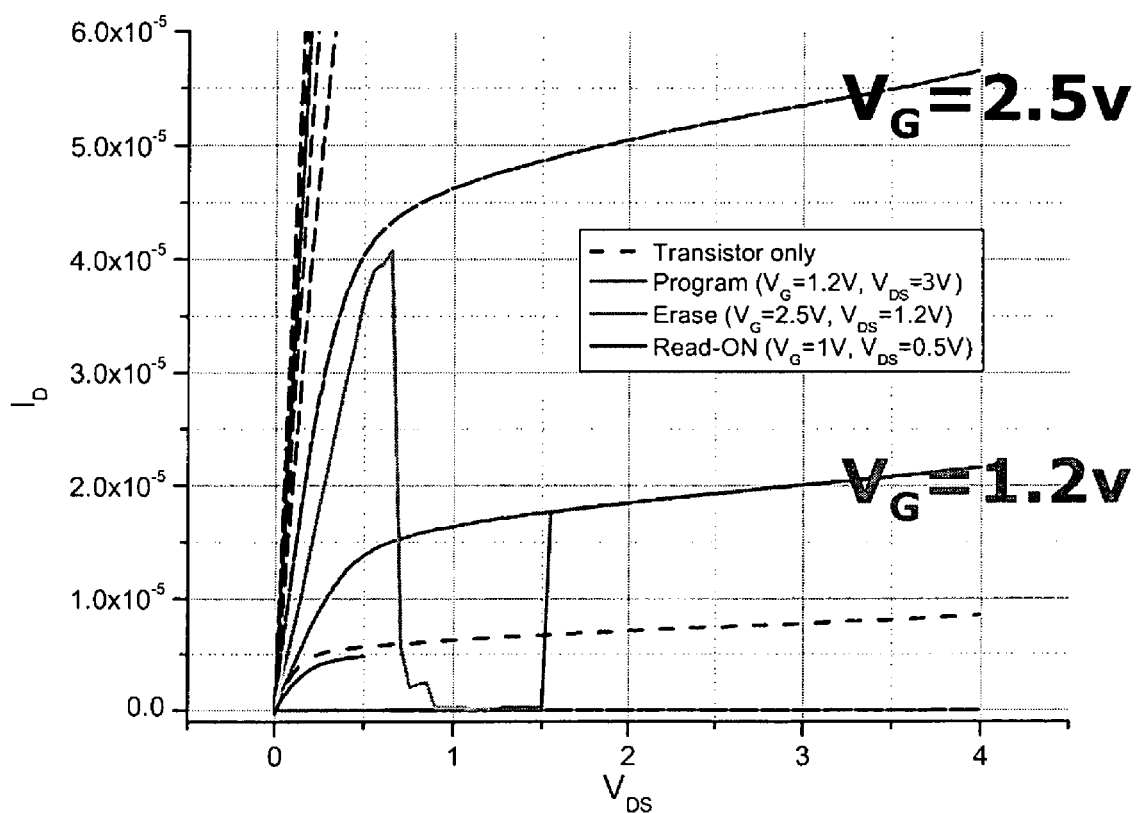
FIG. 10 is a plot of current vs. voltage illustrating operating characteristics of the memory device of FIG. 9.

Throughout the following description of the programming, erasing and reading of this second embodiment of resistive memory device 130, reference is made to FIG. 10 illustrating the operating characteristics of this resistive memory device 130.

Figure 11:
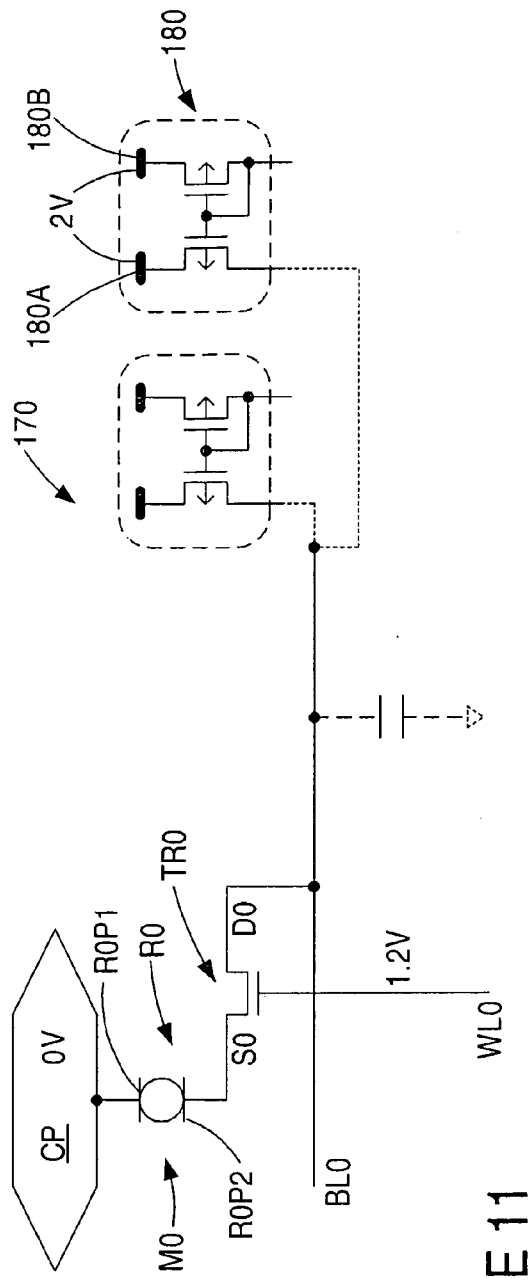
FIG. 11 is a schematic representation of a memory cell of the array of FIG. 2, which array includes a resistive memory device of the type shown in FIG. 9, illustrating a method of writing data to the memory device.

FIG. 11 illustrates the programming of an individual memory cell, for example memory cell M0 of the array 200, for achieving a low-resistance state of the resistive memory device R0 of the type shown and described with regard to FIGS. 9 and 10. As set forth above with regard to FIG. 2, the memory cell M0 includes resistive memory device R0 having electrode R0P1 thereof connected to common plate CP, electrode R0P2 connected to the source S0 of the transistor TR0, and drain D0 of the transistor TR0 connected to the bit line BL0. Also connected to the bit line BL0 are a current source/limiter 170, including p channel transistors connected as a current mirror, and a current source/limiter 180 also including p channel transistors connected as a current mirror. In the programming of the memory cell M0, initially, the common plate is biased at 0V, the bit line BL0 is at 0V, and the terminals of the current source/limiter 180 have 2V applied. The word line WL0 is driven to 1.2V, so that a potential of 2.0 V is applied across the electrodes R0P1, R0P2 from higher to lower potential across the resistive memory device R0 in the direction from the electrode R0P2 to the electrode R0P1. In such state, and with reference to FIG. 10, current flows through the bit line BL0 and transistor TR0, through resistive memory device R0 to the common plate CP. The voltage applied across the electrodes R0P2, R0P1 is sufficient to drive the resistive memory device R0 into a low-resistance state, the current source/limiter 180 and transistor TR0 limiting current to, for example, a relatively low level of approximately 20 uA so as to avoid the possibility of damage to the cell M0.

Figure 12:
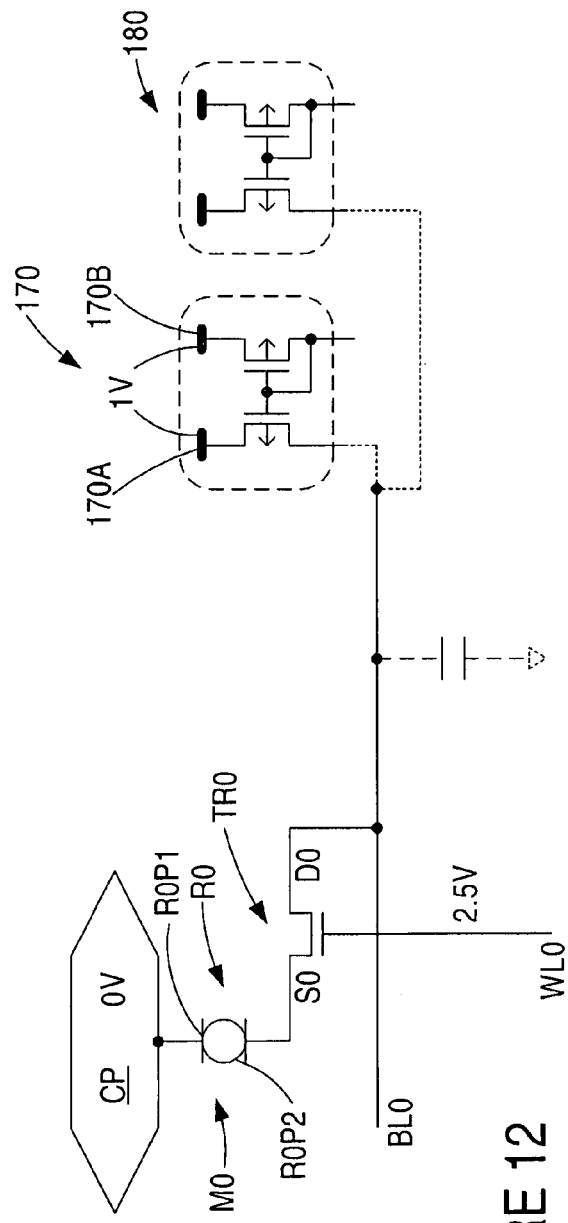
FIG. 12 is a schematic representation of the memory cell of FIG. 11, illustrating a method of erasing the memory device.
Figure 15:
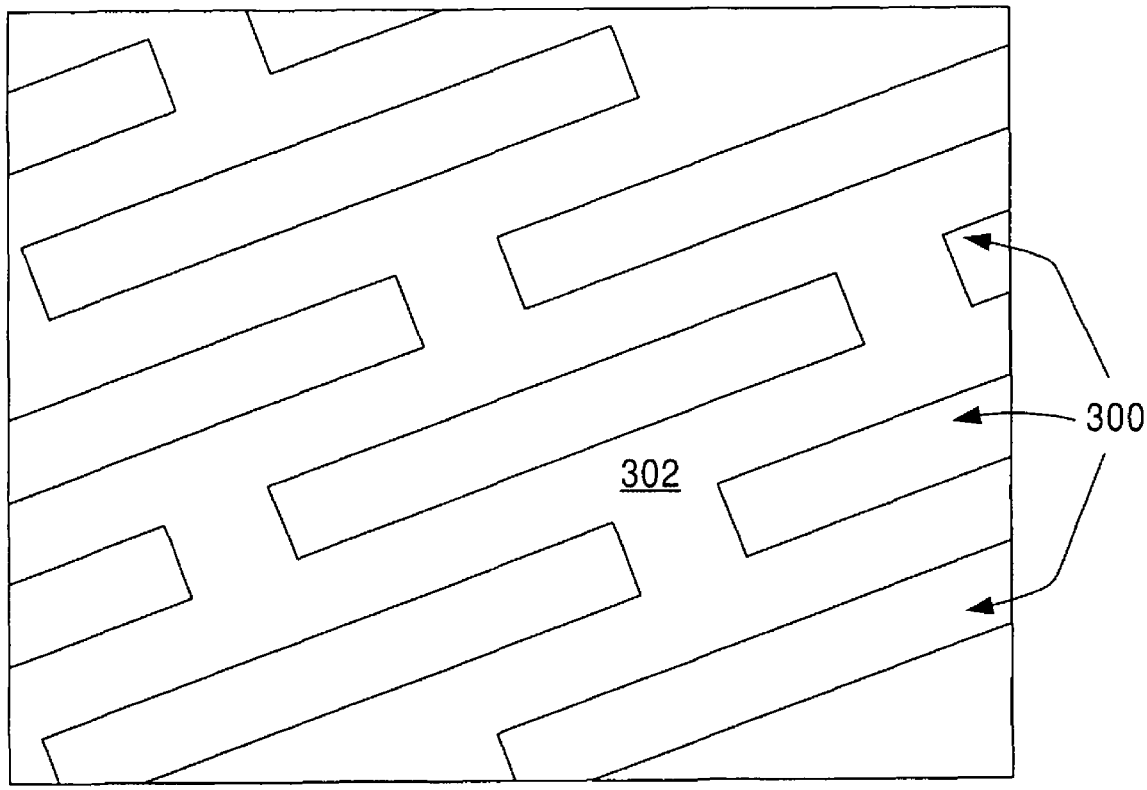
FIGS. 15-25 illustrate process steps for fabricating the array of FIG. 2.

In the erasing of the memory cell M0 (FIG. 12), the terminals of the current source/limiter 170 are set at 1V, so that the voltage at the bit line BL0 is 1V. Meanwhile, the voltage at the common plate CP continues to be held at 0V, so that the voltage across the electrodes R0P1, R0P2 of the resistive memory device R0 is 1V from higher to lower potential in the direction from the electrode R0P2 to the electrode R0P1. The word line WL0 is held at 2.5V. The voltage across the electrodes R0P2, R0P1 is sufficient to drive the resistive memory device R0 into a low-resistance state, the current source/limiter 170 and transistor TR0 limiting current to a relatively low level of approximately 50 uA to again avoid the possibility of damage to the cell M0.

In this particular embodiment, the programming and erasing potentials applied across the electrodes of the memory device R0 are in the same direction, i.e., from higher to lower potential in the direction from the electrode R0P2 to the electrode R0P1. The programming current is limited to a lower level than the erasing current, this being achieved by appropriate sizing of the transistors in the current source/limiter 170 as compared to the sizing of the transistors in the current source/limiter 180, i.e., the transistors of the current source/limiter 170 are larger than the transistors of the current source/limiter 180.

It is also to be noted that the potential applied across the electrodes in the erasing process is carefully limited and controlled because, it will be seen, in accordance with the graph of FIG. 10, excess applied potential will cause the resistive memory device R0 to undesirably adopt its programmed state.

A first approach to reading the state of the memory cell M0 is shown in FIG. 13. In this approach, bit line BL0 has connected thereto a transistor 210 and a sense amplifier 190. The common plate CP continues to be held at 0V, a reference voltage of 0.3V is applied to one input terminal 190A of the sense amplifier 190, and the input terminal 210A of the transistor 210, in its turned on state, is held at 0.6V, which precharges the bit line BL0 to 0.6V, so that voltage of 0.6V is applied to the other input terminal on the sense amplifier 190. 6V is applied to the word line WL0. If the resistive memory device R0 is in a high-resistance state, the bit line BL0 voltage (and the voltage applied to the input terminal 190B of the sense amplifier 190) remain at 0.6V, this voltage being higher than the reference voltage of 0.3V applied to the terminal 190A of the sense amplifier 190, determining a first output state of the sense amplifier 190 corresponding to the erased (high-resistance) state of the memory cell M0. If the resistive memory device R0 is in a low-resistance state, the bit line voltage is driven to 0V, the voltage of the common plate CP. This voltage of 0V is applied to the input terminal 190B of the sense amplifier 190, which voltage is lower than the reference voltage (0.3V) applied to the input terminal 190A of the sense amplifier 190. In this state, the output of the sense amplifier 190 is switched to determine a second output state thereof corresponding to the programmed (low-resistance) state of the memory cell R0.

A second approach to reading the state of the memory cell M0 is shown in FIG. 14. In this approach, bit line BL0 has connected thereto a current source/limiter 220 and a sense amplifier 190. Similar to the above, the current source/limiter 220 includes p channel transistors connected in the form of a current mirror. The common plate CP continues to be held at 0V, a reference voltage of 0.3V is applied to input terminal 190A of the sense amplifier 190, and 0.6V is applied to the terminals 220A, 220B of the current source/limiter 220. 6V is applied to the word line WL0. If the resistive memory device R0 is in a high-resistance state, the bit line BL0 (and the voltage applied to the input terminal 190B of the sense amplifier 190) remain at 0.6V, this voltage being higher than the reference voltage of 0.3V applied to the input terminal 190A of the sense amplifier 190, determining a first output state of the sense amplifier 190 corresponding to the erased (high-resistance) state of the memory cell M0. If the resistive memory device R0 is in a low-resistance state, the bit line voltage is driven to 0V, the voltage of the common plate CP. This voltage of 0V is applied to the input terminal 190B of the sense amplifier 190, which voltage is higher than the reference voltage (0.3V) applied to the input terminal 190A of the sense amplifier 190. In this state, the output of the sense amplifier 190 is switched to determine a second output state thereof corresponding to the programmed (low-resistance) state of the memory cell M0.

Similar to the above, throughout the writing, erasing and reading operations the common plate CP is continuously held that a constant voltage, in this example, 0V. This approach avoids creation of charge-discharge current which would be created with varying voltages on the common plate CP, which would increase power consumption. In addition, the applied voltages and current limits are carefully selected to provide rapid and effective writing, erasing and reading operations, meanwhile with it being insured that there are no high currents which could cause damage to the memory cell or other associated structure.

Alternatively, the active layer 134 of the embodiment of FIG. 9 may be copper oxide, titanium oxide, tantalum oxide, aluminum-tantalum oxide, strontium-tantalum oxide, zirconium oxide, or cobalt oxide.

Figure 16:
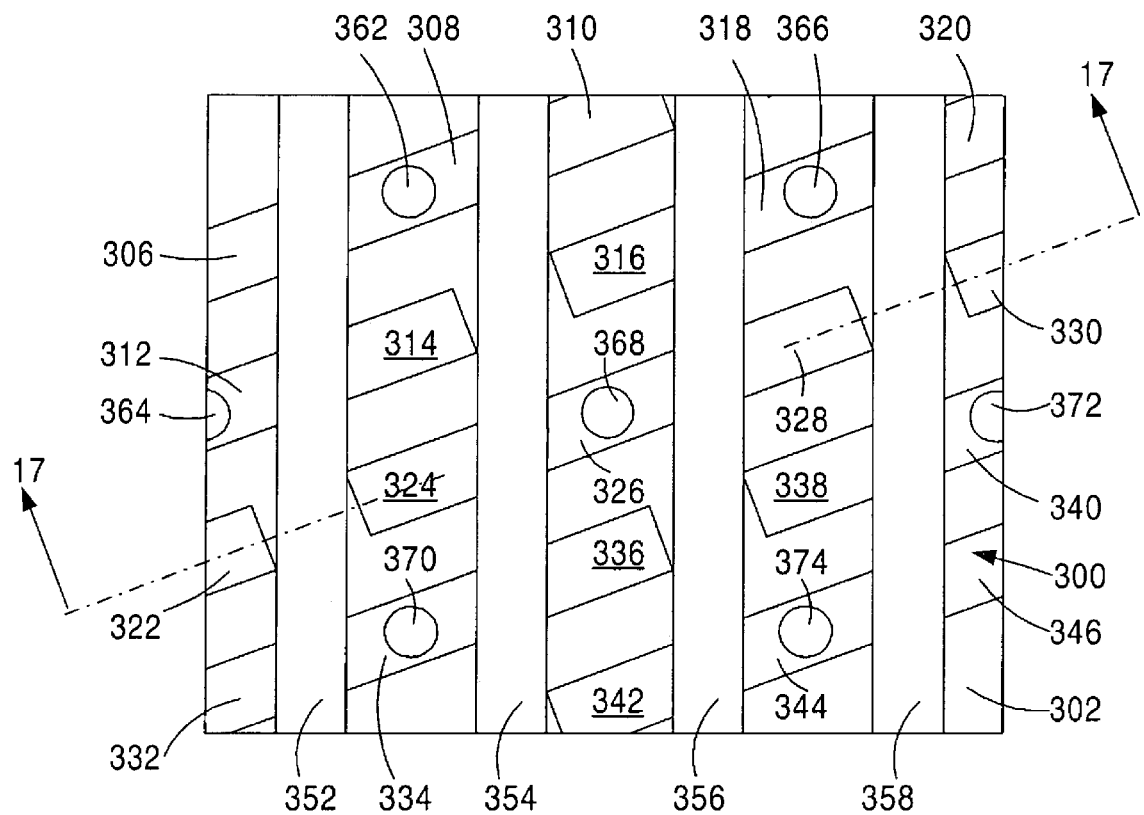
Figure 17:
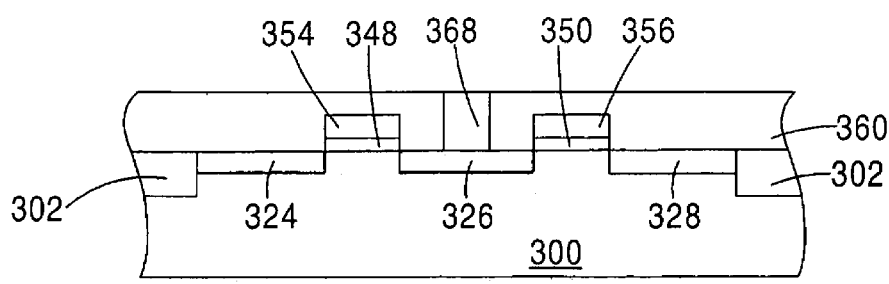

A method of fabricating the array 200 of FIG. 2 is illustrated in FIG. 15-25. Initially, and with reference to FIG. 15, a p type silicon semiconductor substrate 300 is provided, and an isolation region 302 is formed therein. With reference to FIGS. 16 and 17, through the use of well-known techniques, a plurality of isolated n+ diffused regions, for example, diffused regions 306-346 are provided in the substrate 300 within openings in isolation region 302. Spaced oxide strips, for example oxide strips 348, 350 are provided on the substrate 300 as shown, over and on which are provided respective polysilicon strips 352-358. A dielectric layer 360 is provided over the resulting structure, and using standard photoresist techniques, openings are provided through the dielectric layer 360, and the openings are filled with metal, for example tungsten, to form conductive metal plugs (for example plugs 362-374) in contact with the respective n+ regions therebelow (for example, plug 368 in contact with n+ region 326, FIG. 17).

Figure 18:
Figure 19:
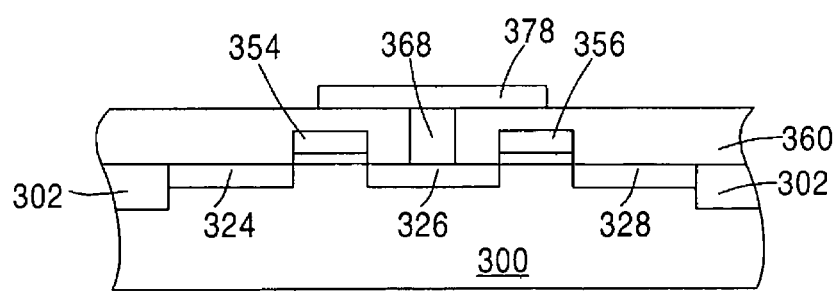

With reference to FIGS. 18 and 19, a metal, for example copper layer is provided over the resulting structure and, using standard photoresist techniques, the layer is patterned to provide spaced-apart elongated conductors 376, 378, 380, each conductor contacting a plurality of plugs (for example conductor 376 contacting plugs 362, 366, conductor 378 contacting plugs 364, 368, 372, and conductor 380 contacting plugs 370, 374.

Figure 20:
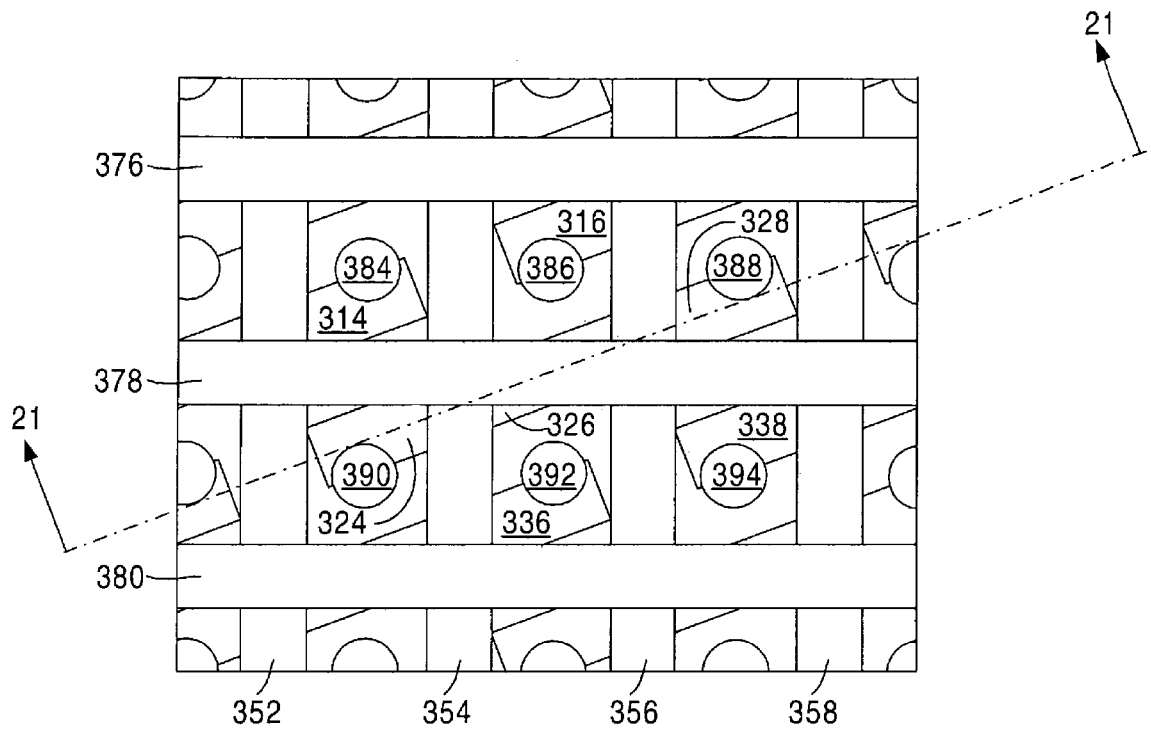
Figure 21:
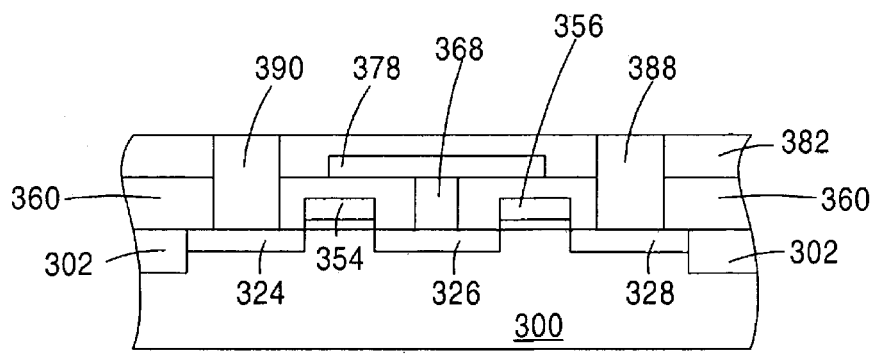

Next, and with reference to FIGS. 20 and 21, a dielectric layer 382 is provided over the resulting structure, and, using standard photoresist techniques, openings are provided therethrough to respective n+ regions (for example openings provided to n+ regions 324, 328, FIG. 21), and the openings are filled with metal, for example tungsten, to form conductive metal plugs (for example plugs 384-394) in contact with the respective n+ regions therebelow (for example, plug 384 in contact with n+ region 314, plug 386 in contact with n+ region 316, plug 388 in contact with n+ region 328, etc.).

Figure 22:
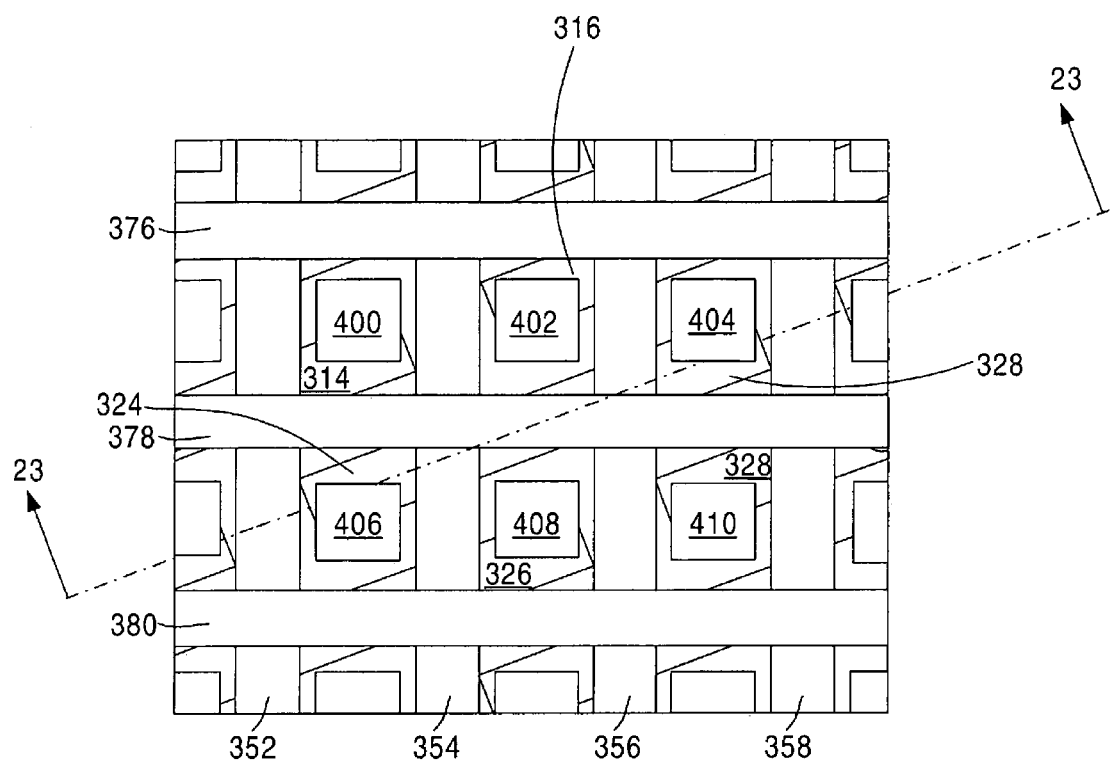
Figure 23:
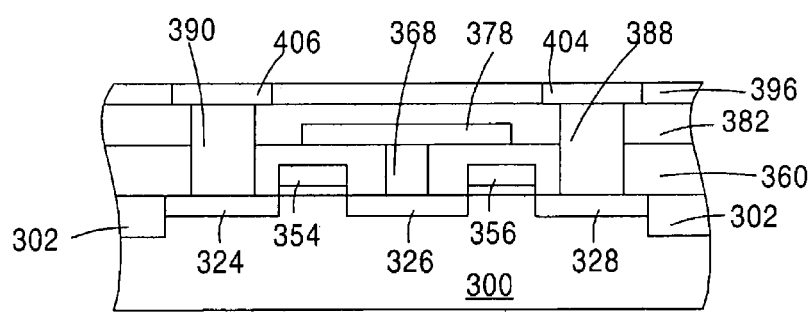

With reference to FIGS. 22 and 23, a dielectric layer 396 is provided over the resulting structure, and is patterned, using standard photoresist techniques, to provide openings therethrough to the respective plugs (for example plugs 384-394). Copper bodies are formed to fill the openings and contact the respective plugs (for example, copper bodies 400-410 contacting the respective plugs 384-394).

Figure 24:
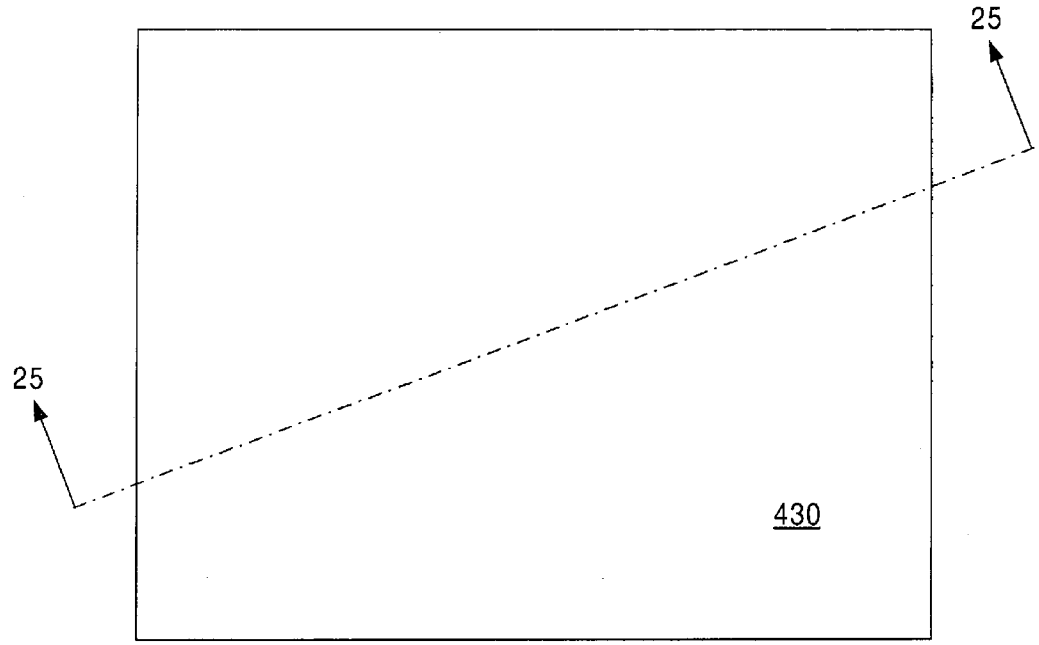
Figure 25:
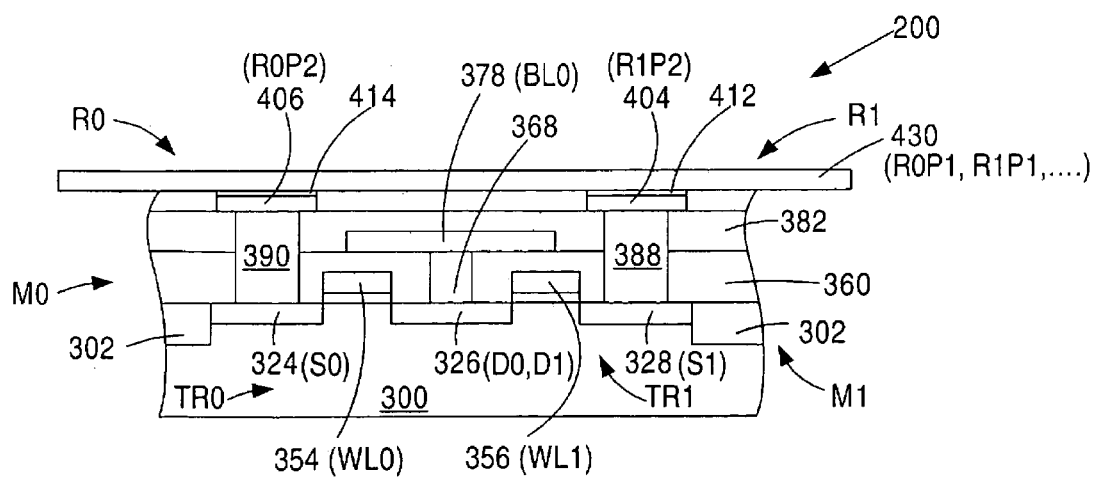

Then, the exposed surfaces of the respective copper bodies 400-410 are oxidized to form copper oxide thereon (for example copper oxide body 412 formed on copper body 404, copper oxide body 414 formed on copper body 406, etc., FIG. 25). With further reference to FIGS. 24 and 25, a copper plate 430 is formed over the resulting structure, contacting the respective copper oxide bodies (for example, copper plate 430 contacting copper oxide bodies 412, 414, FIG. 25).

The structure of FIG. 25 makes up a pair of memory cells, for example, memory cell M0 and memory cell M1, of the memory array 200 of FIG. 2. As such, the elements 354, 356 are the word lines WL0, WL1, and the conductor 378 is the bit line BL0. The n+ region 324 (source S0), n+ region 326 (drain D0), and word line 354 make up the transistor TR0, and the n+ region 328 (source S1), n+ region 326 (drain D1), and word line 356 make up the transistor TR1. The copper body 406, copper oxide 414 and copper plate 430 make up the respective electrode R0P2, active layer, and electrode R0P1 of the resistive memory device R0, while the copper body 404, copper oxide and copper plate 430 make up the respective electrode R1P2, active layer, and electrode R1P1 of the resistive memory device R1.

The electrodes R0P1, R1P1 . . . , commonly connected as shown in FIG. 2, take the form of a common plate 430 overlying the transistors, word lines and bit lines of array 200. The common plate forms part of each of the resistive memory devices, with the electrodes R0P1, R1P1 . . . , being part of that common plate 430.

The resistive memory devices, including the common plate 430, are formed at the end of the process shown and described, after the formation of the transistors. The process of forming the transistors is completed before formation of the resistive memory devices, avoiding thermal budget problems which might arise if the formation of the transistors was undertaken later in the process. Another advantage of the current approach is that in the past, typically, elongated conductors forming the bit lines were provided at the top of the structure. This requires fine bit line patterning at the top of the structure, which is difficult using current lithographic techniques. This is so because as layers of the structure are built up, the layers toward the top of the structure have decreased planarity, making it difficult to focus the lithographic equipment accurately. The present approach avoids that problem by providing that the top layer need not be patterned at all, i.e., it is a simple plate. Thus, improved manufacturing simplicity and efficiency are achieved.

It will be seen that herein are provided effective methods of programming, erasing and reading memory cells which include resistive memory devices. Further provided is a process for fabricating an array which meets the needs of effective programming, erasing and reading of memory cells thereof, which process is highly efficient and effective in achieving the desired product.

The foregoing description of embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory structure comprising:
   a resistive memory device;
   a transistor;
   a word line connected to the gate of the transistor;
   a bit line;
   one terminal of the transistor being connected to the resistive memory device, the other terminal of the transistor being connected to the bit line; and
   first and second current source/limiting structures connected to the bit line.

2. The memory structure of claim 1 and further comprising a sense amplifier connected to the bit line.

3. A memory array comprising:
   a plurality of word lines;
   a plurality of bit lines;
   a plurality of memory structures, each comprising a transistor and a resistive memory device, the resistive memory device comprising first and second electrodes and an active layer between the first and second electrodes, one terminal of the transistor being connected to a bit line, the other terminal of the transistor being connected to the first electrode of the resistive memory device, the gate of the transistor being connected to a word line, the second electrodes of the resistive memory devices being connected in common, wherein first and second current source/limiting structures are connected to each bit line.

4. The memory device of claim 3 wherein the second electrodes are connected by means of a common plate.

5. The memory device of claim 4 wherein the second electrodes are part of the common plate.

6. A memory device comprising:
   a substrate;
   a common plate over the substrate;
   a plurality of resistive memory devices over the substrate, wherein the common plate makes part of each of the resistive memory devices; and
   a bit line overlying the substrate, the common plate overlying the bit line, wherein first and second current source/limiting structures are connected to the bit line.

7. The memory device of claim 6 and further comprising a transistor comprising a source and a drain in the substrate, and a gate, the common plate overlying the transistor.

8. The memory device of claim 7 wherein the transistor is in operative association with a resistive memory device.

9. The memory device of claim 8 wherein the gate of the transistor is a word line, the common plate overlying the word line.

10. The memory device of claim 3 and further comprising a sense amplifier communicatively coupled to each bit line.

11. The memory device of claim 6 and further comprising a sense amplifier communicatively coupled to the bit line.

12. The memory device of claim 6 wherein an electrode of each resistive memory device is connected by means of the common plate.

13. The memory device of claim 12 wherein the electrode of each resistive memory device is part of the common plate.

* * * * *